(12) United States Patent
Dong

(10) Patent No.: US 8,142,924 B2
(45) Date of Patent: Mar. 27, 2012

(54) BATTERY COVER MECHANISM

(75) Inventor: Shui-Jin Dong, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 446 days.

(21) Appl. No.: 12/430,982

(22) Filed: Apr. 28, 2009

(65) Prior Publication Data

US 2009/0325048 A1 Dec. 31, 2009

(30) Foreign Application Priority Data

Jun. 30, 2008 (CN) .......................... 2008 1 0302444

(51) Int. Cl.
*H01M 2/10* (2006.01)
(52) U.S. Cl. .......... 429/175; 429/96; 429/100; 429/123; 429/163

(58) Field of Classification Search .................. 429/175, 429/96, 123, 100, 163
See application file for complete search history.

(56) References Cited

U.S. PATENT DOCUMENTS

2006/0166083 A1* 7/2006 Zhang et al. .................... 429/97
* cited by examiner

*Primary Examiner* — Jane Rhee
(74) *Attorney, Agent, or Firm* — Altis Law Group, Inc.

(57) ABSTRACT

A battery cover mechanism used in a portable electronic device includes a housing, a cover and an operating member. The housing defines a receiving groove therein for receiving a battery. The cover corresponds to the housing and is movably mounted on the housing. The operating member is movably mounted on the housing. The operating member is held on the housing to hold the cover such that the cover is closed to cover the receiving groove, and the operating member is moved to drive the cover to move such that the cover is opened.

12 Claims, 6 Drawing Sheets

BATTERY COVER MECHANISM

BACKGROUND

1. Field of the Invention

The present invention relates to battery cover mechanisms, particularly to a battery cover mechanism used in portable electronic devices.

2. Description of Related Art

Portable electronic devices such as mobile phones and personal digital assistants (PDA) are widely used. Changeable batteries are installed in most portable electronic devices to supply electric power. When a battery is installed in a portable electronic device, it is generally shielded and fixed in place by a battery cover mechanism, thus the battery and the inner circuits of the portable electronic device are protected.

A conventional battery cover mechanism generally includes a cover and a housing. The cover includes a pin formed on one end thereof and at least one holding hook formed on an opposite end thereof. The housing defines a receiving hole corresponding to the pin and at least one holding aperture corresponding to the holding hook. In assembly, the holding hook is inserted into the holding aperture, and then the cover is pushed towards the housing until the pin is inserted into the receiving hole. Thus, the cover tightly engages with the housing to be held thereon. However, due to the tight engagement of the cover and the housing, a significant amount of impact and friction exist between the cover and the housing. As a result, the user may need to apply a significant amount of strength to assemble/disassemble the cover to/from the housing. Further, the cover and the housing may be distorted or even damaged by impact or friction between each other in the assembly/disassembly operation.

Therefore, there is room for improvement within the art.

BRIEF DESCRIPTION OF THE DRAWINGS

Many aspects of the present battery cover mechanism can be better understood with reference to the following drawings. The components in the various drawings are not necessarily drawn to scale, the emphasis instead being placed upon clearly illustrating the principles of the present battery cover mechanism. Moreover, in the drawings, like reference numerals designate corresponding parts throughout the diagrams.

DETAILED DESCRIPTION OF THE EMBODIMENT

Figure 1:
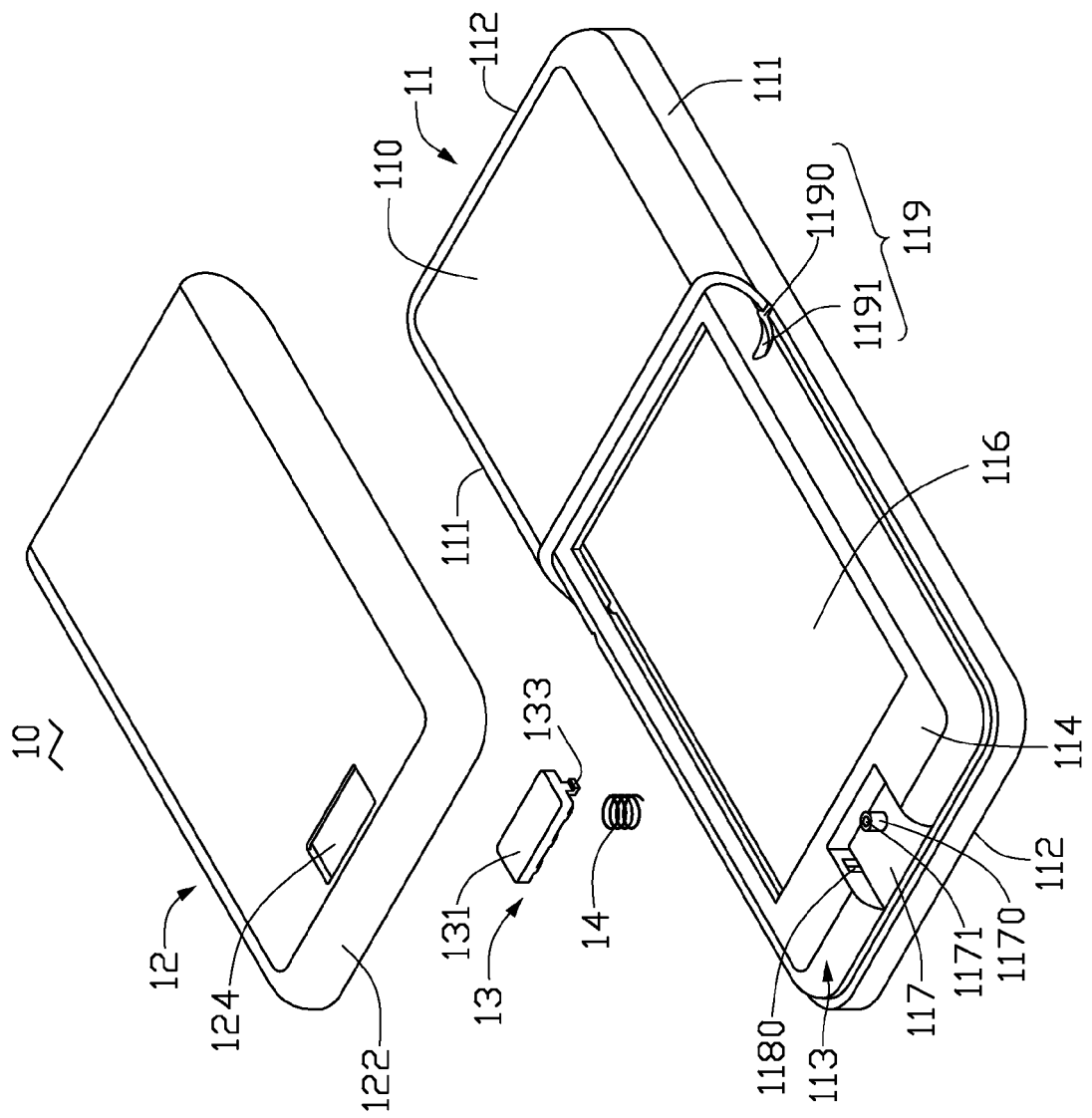
FIG. 1 is a disassembled view of a battery cover mechanism, according to an exemplary embodiment.
Figure 2:
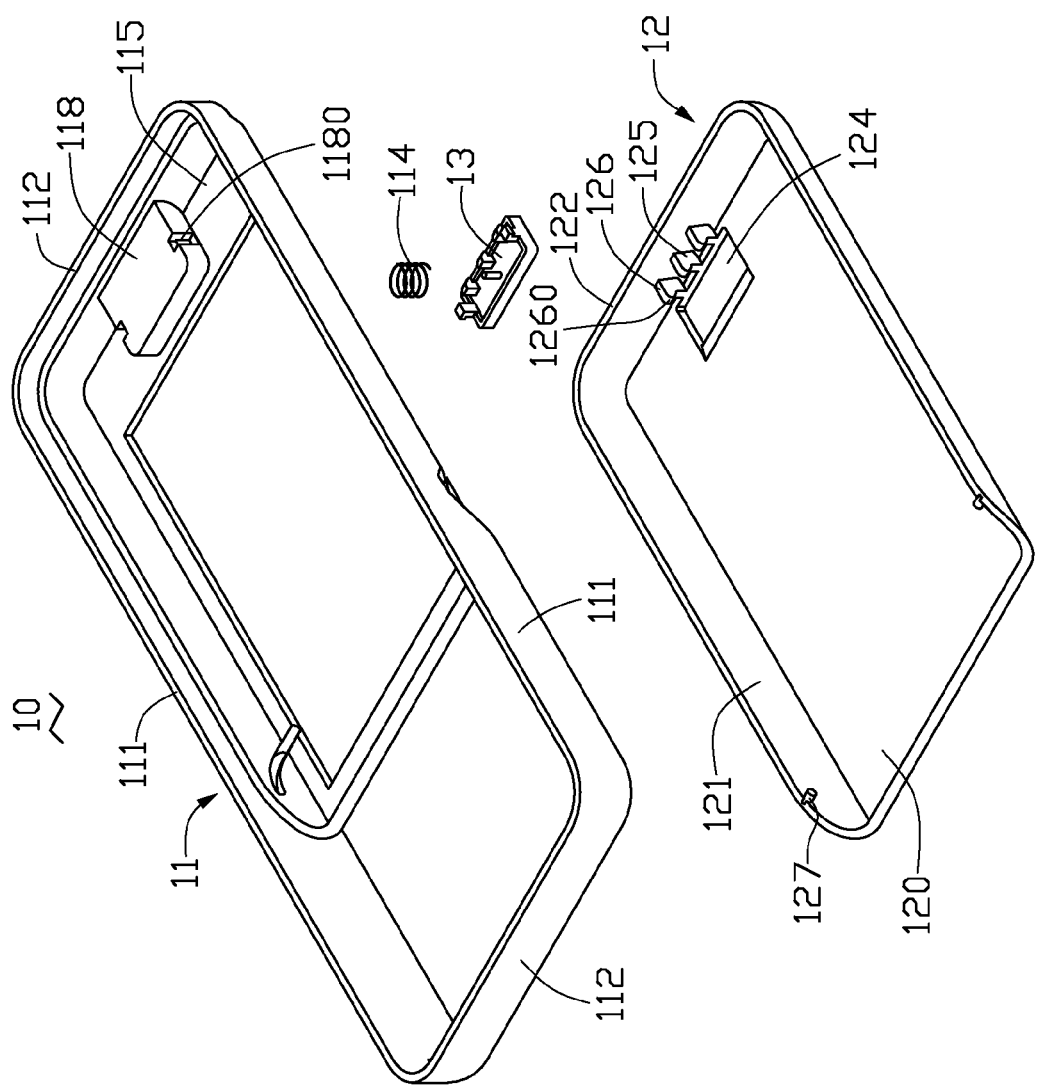
FIG. 2 is a disassembled view of the battery cover mechanism shown in FIG. 1, but shown in another view angle.

FIGS. 1 and 2 show a battery cover mechanism 10 according to an exemplary embodiment. While the exemplary battery cover mechanism 10 is used in a mobile phone, it can also be used in other portable electronic devices, such as a personal digital assistant (PDA), a digital camera, etc. The battery cover mechanism 10 includes a housing 11, a cover 12, an operating member 13 and an elastic member 14.

The housing 11 can be a part of the housing of a portable electronic device. The housing 11 includes a planar assembling surface 110, two opposite side walls 111 formed on two relative long sides of the housing 11 and two opposite end walls 112 formed on two relative short sides of the housing 11. The side walls 111 and the end walls 112 extend perpendicularly to the assembling surface 110, thereby forming a frame (not labeled) surrounding another surface (not labeled) of the housing 11 opposite to the assembling surface 110. Thus, the housing 11 can be assembled to a main body (not shown) of the portable electronic device 10 by the side walls 111 and the end walls 112, with the assembling surface 110 entirely exposed.

A recessed part of the assembling surface 110 forms an assembling portion 113, which has an outside surface 114 positioned next to the operating surface 110 and an inside surface 115 opposite to the outside surface 114. A recessed central part of the outside surface 114 forms a receiving groove 116 for receiving a battery (not shown). A recessed part of the outside surface 114 adjacent to an end wall 112 forms an assembling recess 117, and then a corresponding protrusion 118 is formed on the inside surface 115. Two opposite side surfaces of the protrusion 118 respectively define an aperture 1180 communicating with the assembling recess 117. A cylindrical locating pole 1170 is formed on the bottom surface of the assembling recess 117 and disposed perpendicular to the bottom surface. The locating pole 1170 defines a coaxial cylindrical locating hole 1171 therein.

The housing 11 also defines two leading grooves 119. Each leading groove 119 includes a locating portion 1190 communicating with a leading portion 1191. The two locating portions 1190 are correspondingly defined in the two opposite side walls 111. Each locating portion 1190 is a through hole perpendicularly running through its corresponding side wall 111. The two leading portions 1191 are arc-shaped grooves respectively running through two opposite sides of the assembling portion 113, and each leading portion 1191 has an end communicating with a corresponding locating portion 1190.

The cover 12 is a sheet corresponding in shape to the housing 11. The cover 12 has a planar mounting surface 120, and an approximately U-shaped side frame 121 perpendicularly formed on a peripheral portion of the mounting surface 120 to surround three sides of the mounting surface 120. The side frame 121 includes an end wall 122 and two opposite side walls 123 respectively connected to two ends of the end wall 122. The inner shape of the side frame 121 is configured to correspond to the outside shape of the assembling portion 113, thus the side frame 121 can engage with the assembling portion 113 such that the cover 12 is assembled to the housing 11 to cover the battery in the receiving groove 116.

The cover 12 defines a rectangular operating hole 124 adjacent to the end wall 122 therein. The position of the operating hole 124 corresponds to that of the assembling recess 117. At least one engaging members 125 are formed on the mounting surface 120 and positioned between the operating hole 124 and the end wall 122. Each engaging member 125 is a protrusion extending from the mounting surface 120 and includes a protruding engaging portion 126 extending towards the operating hole 124. Each engaging portion 126 has an arc-shaped engaging surface 1260. Two leading poles 127 are respectively formed on the two side walls 121 and disposed adjacent to an end of the cover 12 opposite to the end wall 122. Each leading pole 127 perpendicularly extends from an inner surface of a side wall 121. The two leading poles 127 are configured to correspond to the two leading grooves 119, respectively, such that they can be slid or rotated in the leading grooves 119, and can also be held in the locating portions 1190.

Figure 3:
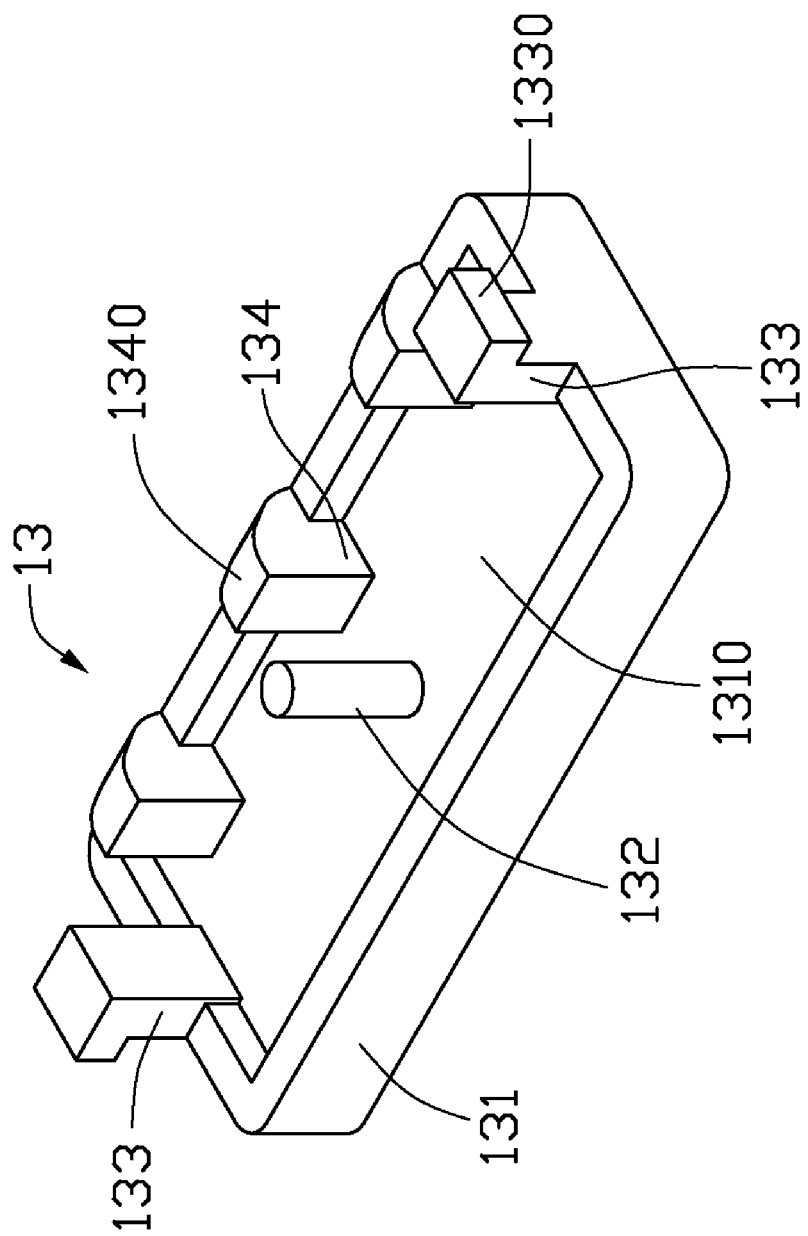
FIG. 3 is a schematic view of an operating member of the battery cover mechanism shown in FIG. 1.

Also referring to FIG. 3, the operating member 13 includes an operating portion 131, a holding pole 132, two holding hooks 133 and a plurality of supporting portions 134. The operating portion 131 is an approximately rectangular board corresponding to the operating hole 124 and the assembling recess 117, and the holding pole 132, the holding hooks 133 and the supporting portions 134 are all formed on a rectangular surface 1310 of the operating portion 131. The holding pole 132 is a cylindrical pole perpendicularly extending from a central portion of the surface 1310 and corresponding to the locating hole 1171. The holding hooks 133 perpendicularly extend from two opposite sides of the surface 1310, respectively, and then bend away from each other to form two holding portions 1330 respectively corresponding to the apertures 1180. The supporting portions 134 are protrusions formed on another side of the surface 1310 and corresponding to the engaging members 125. Each supporting portion 134 has an arc-shaped supporting surface 1340 formed thereon for engaging with the engaging surface 1260 of its corresponding engaging member 125, and the supporting surface 1340 and the engaging surface 1260 can slide relative to each other. The elastic member 14 is a cylindrical spring capable of being coiled around the locating pole 11170.

Figure 4:
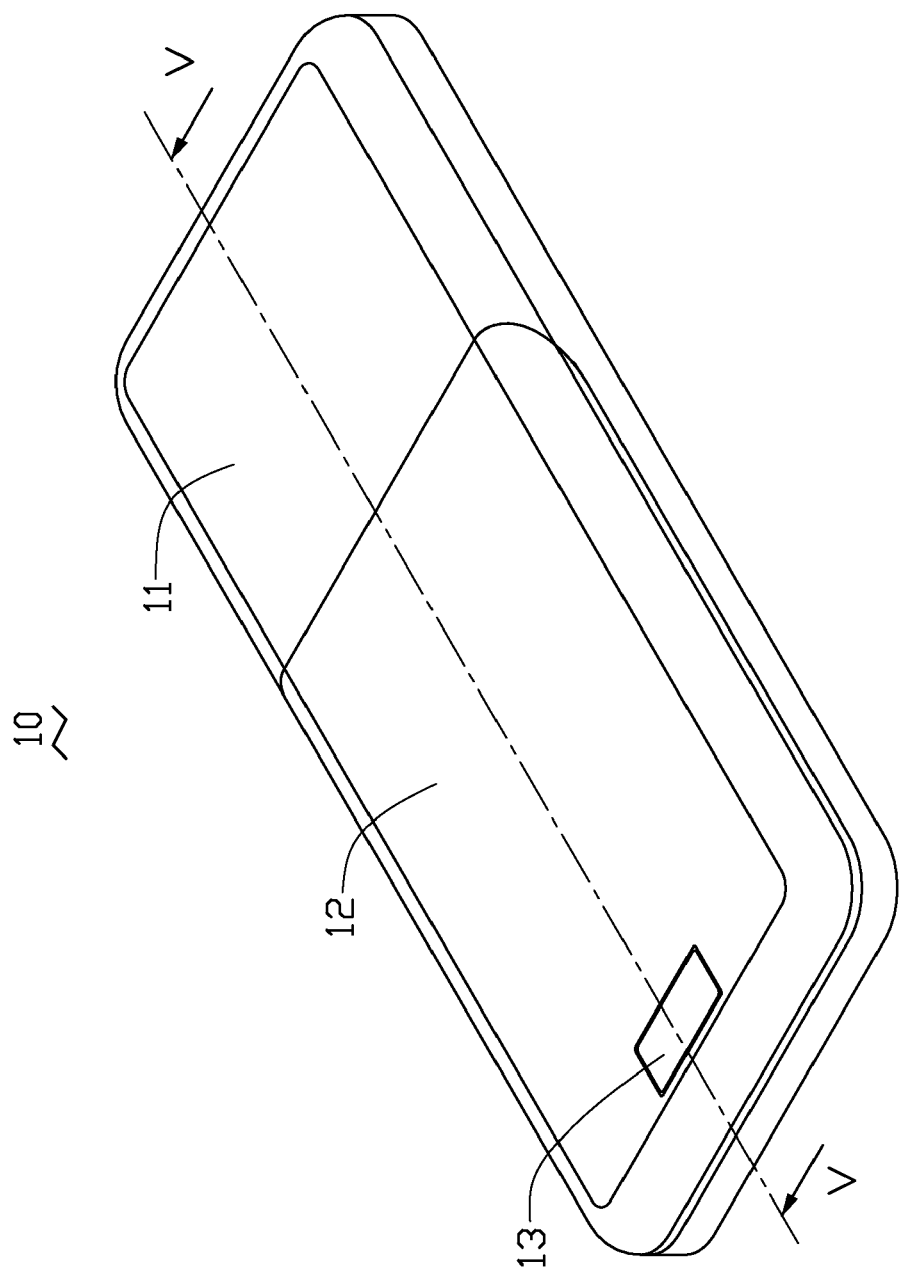
FIG. 4 is an assembled view of the battery cover mechanism shown in FIG. 1.
Figure 5:
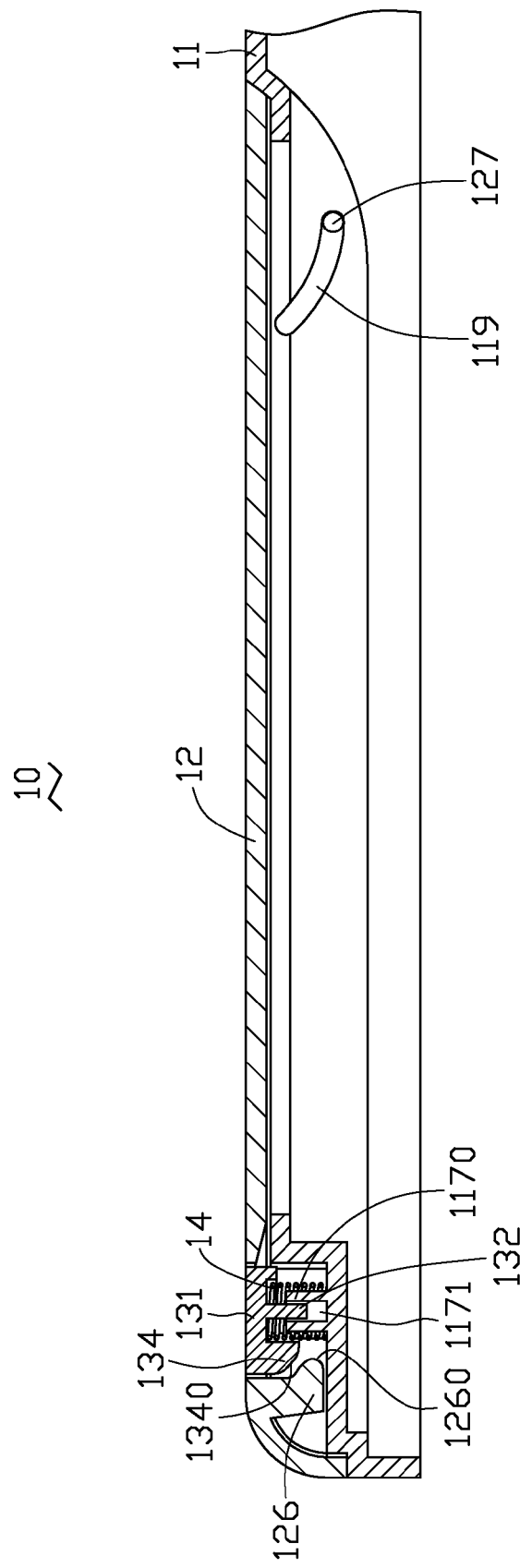
FIG. 5 is a cutaway view along the line V-V shown in FIG. 4.
Figure 6:
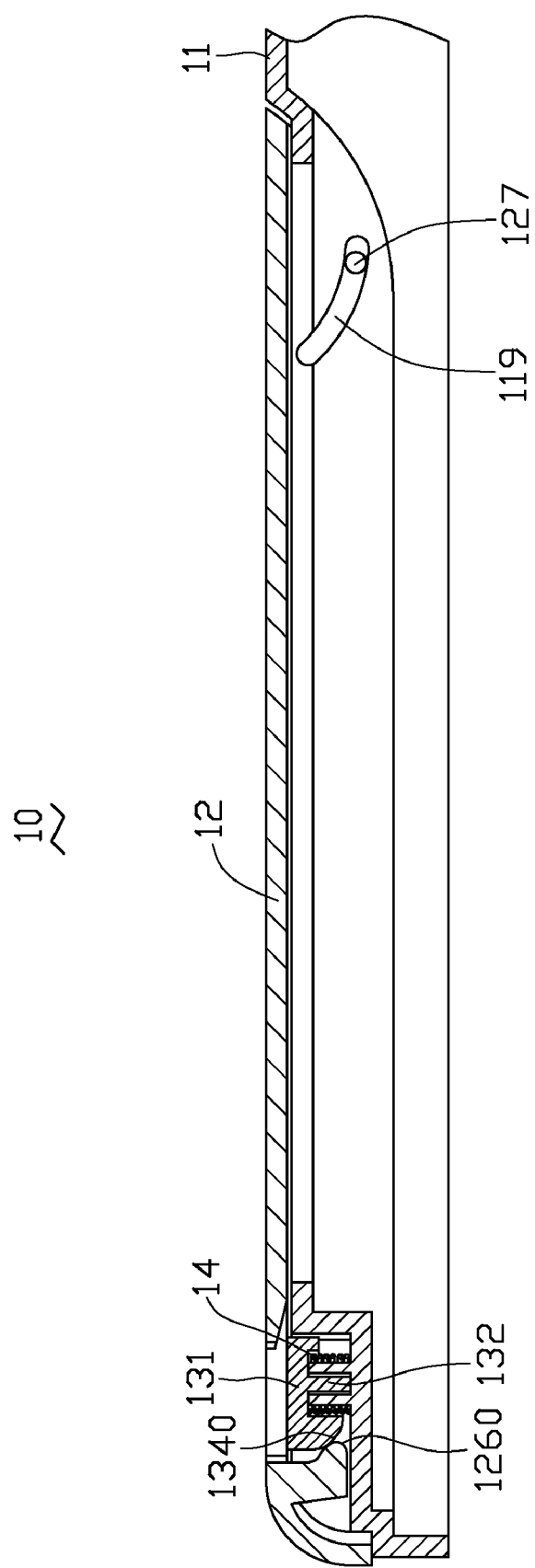
FIG. 6 is a cutaway view along the line V-V shown in FIG. 4, wherein the battery cover mechanism is opened.

Also referring to FIG. 4, FIG. 5 and FIG. 6, in assembly, the elastic member 14 is coiled around the locating pole 1170. The operating portion 131 is received in the assembling recess 117, the holding pole 132 is inserted into the locating hole 1171, and two ends of the elastic member 14 are respectively resisted on the surface 1310 and the bottom surface of the assembling recess 117. The two holding portions 1330 are respectively inserted into the two apertures 1180, thus the operating member 13 is assembled to the housing 11. The elastic member 14 rebounds to push the operating portion 131 away from the housing 11 until the holding portions 1330 are blocked by the housing 11. Thus, the operating member 13 is movably installed on the housing 11, and the operating portion 131 entirely exposes out of the assembling recess 117 to be capable of being received in the operating hole 124.

The two leading poles 127 are respectively received in the two leading grooves 119 to assemble the cover 12 to the housing 11. When closing the cover 12, the operating member 13 is held on the housing 11 by the above-mentioned method. The leading poles 127 are pushed to slide along the leading portions 1191 such that the operating portion 131 is aligned with the operating hole 124. Afterwards, the cover 12 is pressed towards the housing 11 to receive the operating portion 131 in the operating hole 124. Continuing to press the cover 12, the leading poles 127 are respectively received and further held in the locating portions 1190. The engaging surface 1260 of each engaging portion 126 is driven to slide relative to its corresponding supporting surface 1340, and the engaging portions 126 are positioned between their corresponding supporting portions 134 and the housing 11. Thus, the cover 12 is held on the housing 11 to cover the receiving groove 116, and the operating portion 131 has a surface (i.e., the surface opposite to the surface 1310) exposed out of the operating hole 124.

When the cover 12 needs to be opened, the exposed surface of the operating portion 131 is pressed. The supporting portions 134 are then pushed towards the housing 11, and the engaging portions 126 positioned between the supporting portions 134 and the housing 11 are pushed outwards by their corresponding supporting portions 134. At the same time, the leading poles 127 are driven to slide along the leading portions 1191, such that the cover 12 is driven to move along the outside surface 114. When the engaging portions 126 are pushed out and released, the cover 12 is not limited by the supporting portions 134 of the operating member 13. Thus, the partially released cover 12 can be rotated relative to the housing 11 through the leading poles 127 to open.

In the exemplary battery cover mechanism 10, the cover 12 is installed on the housing 11 through the operating member 13 and the elastic member 14, and can be detached from the housing 11 by operating the operating member 13. The cover 12 and the housing 11 need not directly tightly engage with each other, thus there is not much impact or friction generated between the cover 12 and the housing 11 in assembly and disassembly operations. Therefore, the cover 12 and the housing 11 can be well protected.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A battery cover mechanism used in a portable electronic device, comprising:
    a housing including a locating pole and defining a receiving groove for receiving a battery;
    a cover corresponding to the housing and movably mounted on the housing, the cover including a plurality of engaging portions;
    an operating member movably mounted on the housing, the operating member including an operating portion, a holding pole and a plurality of supporting portions formed on the operating portion, and the holding pole inserted in the locating pole; and
    a helical spring coiled around the locating pole, two ends of the elastic member respectively resisted by the operating member and the housing;
    wherein the supporting portions hold the engaging portions of the cover closed to cover the receiving groove, and when the operating portion is pressed, the supporting portion can be moved with the operating portion to open the cover.

2. The battery cover mechanism as claimed in claim 1, wherein the cover includes two leading poles respectively formed on two opposite side walls thereof and the housing defines two leading grooves corresponding to the leading poles therein, the leading poles being respectively received in the leading grooves to mount the cover on the housing.

3. The battery cover mechanism as claimed in claim 2, wherein each leading grooves includes an arc-shaped leading portion allowing the corresponding leading pole to be slid or rotated therein and a locating portion communicating with the leading portion and being capable of holding the leading pole therein.

4. The battery cover mechanism as claimed in claim 1, wherein the cover defines an operating hole corresponding to the operating portion therein, the operating portion being received in the operating hole and exposes out of the operating hole when the cover is closed.

5. The battery cover mechanism as claimed in claim 1, wherein the operating member further includes two holding hooks and the housing defines two apertures therein, the holding hooks being received in the apertures to mount the operating member on the housing.

6. A battery cover mechanism, comprising:
a housing including a locating pole and defining a receiving groove for receiving a battery;
a cover corresponding to the housing and movably mounted on the housing to cover the receiving groove, the cover including a plurality of engaging portions;
an operating member movably mounted on the housing and including an operating portion, a holding pole corresponding to the locating pole and a plurality of supporting portion corresponding to the engaging portion formed on the operating portion, and the holding pole inserted in the locating pole; and
a helical spring coiled around the locating pole, two ends of the elastic member respectively resisted by the operating member and the housing;
wherein the engaging portions are positioned between the supporting portions and the housing to hold the cover on the housing when the cover is closed, and the engaging portions are released by pressing the operating portion to move the supporting portions and open the cover.

7. The battery cover mechanism as claimed in claim 6, wherein the cover includes two leading poles respectively formed on two opposite side walls thereof and the housing defines two leading grooves corresponding to the leading poles therein, the leading poles being respectively received in the leading grooves to mount the cover on the housing.

8. The battery cover mechanism as claimed in claim 7, wherein each leading grooves includes an arc-shaped leading portion allowing the corresponding leading pole to be slid or rotated therein and a locating portion communicating with the leading portion and being capable of holding the leading pole therein.

9. The battery cover mechanism as claimed in claim 6, wherein the cover defines an operating hole corresponding to the operating portion therein, the operating portion being received in the operating hole and exposes out of the operating hole when the cover is closed.

10. The battery cover mechanism as claimed in claim 6, wherein the operating member further includes two holding hooks and the housing defines two apertures therein, the holding hooks being received in the apertures to mount the operating member on the housing.

11. The battery cover mechanism as claimed in claim 5, wherein the operating portion is substantially a planar board, and all of the holding pole, the supporting portions, and the holding hooks substantially perpendicularly extend from a same surface of the operating portion; the holding pole positioned between the two holding hooks, and all of the supporting portions positioned to be substantially collinear.

12. The battery cover mechanism as claimed in claim 10, wherein the operating portion is substantially a planar board, and all of the holding pole, the supporting portions, and the holding hooks substantially perpendicularly extend from a same surface of the operating portion; the holding pole positioned between the two holding hooks, and all of the supporting portions positioned to be substantially collinear.

* * * * *